United States Patent [19]
Jang et al.

[11] Patent Number: 5,786,260
[45] Date of Patent: Jul. 28, 1998

[54] METHOD OF FABRICATING A READABLE ALIGNMENT MARK STRUCTURE USING ENHANCED CHEMICAL MECHANICAL POLISHING

[75] Inventors: Syun-Ming Jang, Hsin-Chu; Ying-Ho Chen, Taipei; Chung-Long Chang, Dou-Liu; Chen-Hua Yu, Hsin-Chu, all of Taiwan

[73] Assignee: Taiwan Semiconductor Manufacturing Company, Ltd., Hsin-Chu, Taiwan

[21] Appl. No.: 767,015

[22] Filed: Dec. 16, 1996

[51] Int. Cl.$^6$ ............................................. H01L 23/58
[52] U.S. Cl. ................ 438/401; 438/975; 148/DIG. 102
[58] Field of Search ............................... 438/401, 975; 148/DIG. 102

[56] References Cited

U.S. PATENT DOCUMENTS

| | | | |
|---|---|---|---|
| 4,944,836 | 7/1990 | Beyer et al. | 156/645 |
| 5,256,591 | 10/1993 | Jun | 438/424 |
| 5,275,965 | 1/1994 | Manning | 437/67 |
| 5,456,756 | 10/1995 | Ramaswami et al. | 118/721 |
| 5,503,962 | 4/1996 | Caldwell | 430/317 |
| 5,640,053 | 6/1997 | Caldwell | 257/797 |

*Primary Examiner*—Jey Tsai
*Attorney, Agent, or Firm*—George O. Saile; Stephen B. Ackerman; William J. Stoffel

[57] ABSTRACT

A structure of a readable alignment mark and method of manufacturing the readable alignment mark in an alignment mark area on a semiconductor substrate. A semiconductor substrate 10 comprising a product area 12 and an alignment mark area 30 is provided. The alignment mark area 30 has an outer area 40 and an inner area 50. The outer area surrounds 40 the inner area 50. A plurality of alignment mark trenches 24 is formed in the substrate 10 within the inner area 50. A pad oxide layer 20 and a silicon nitride layer 44 are formed sequentially in at least the alignment mark area 12. An isolation trench 43 is formed in the substrate 10 in at least the outer area 40. An insulating layer 46 is formed at least over the alignment mark area 30. The insulating layer 46 is chemical-mechanical polished thereby removing a first thickness of the insulating layer from the inner alignment mark area 50 and leaving a residual insulating layer 46A in the alignment mark trenches 48. Etches are used to remove the residual insulating layer 46A, silicon nitride layer 44, and pad oxide layer 42 in the alignment mark area 30 thereby exposing the alignment marks 48 and making the alignment marks readable.

22 Claims, 4 Drawing Sheets

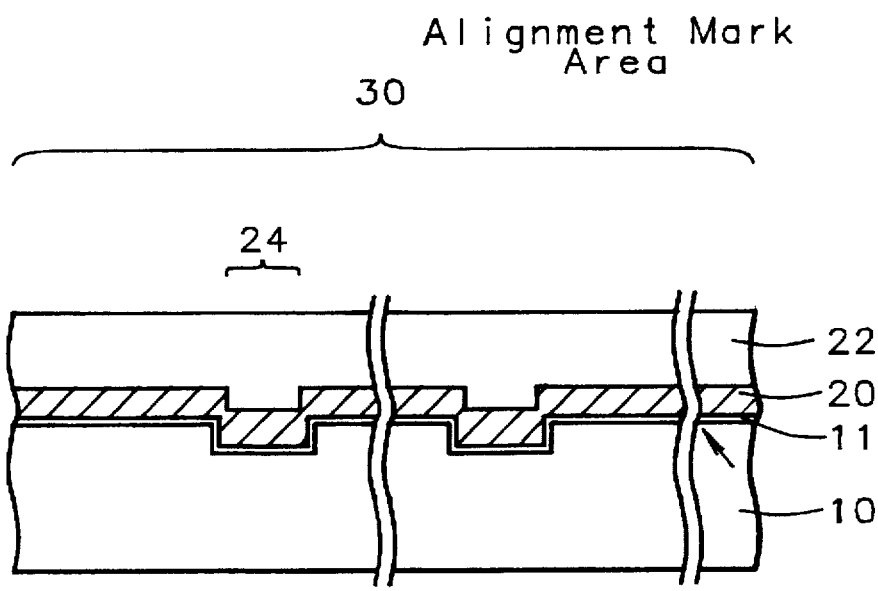
FIG. 1A – Prior Art
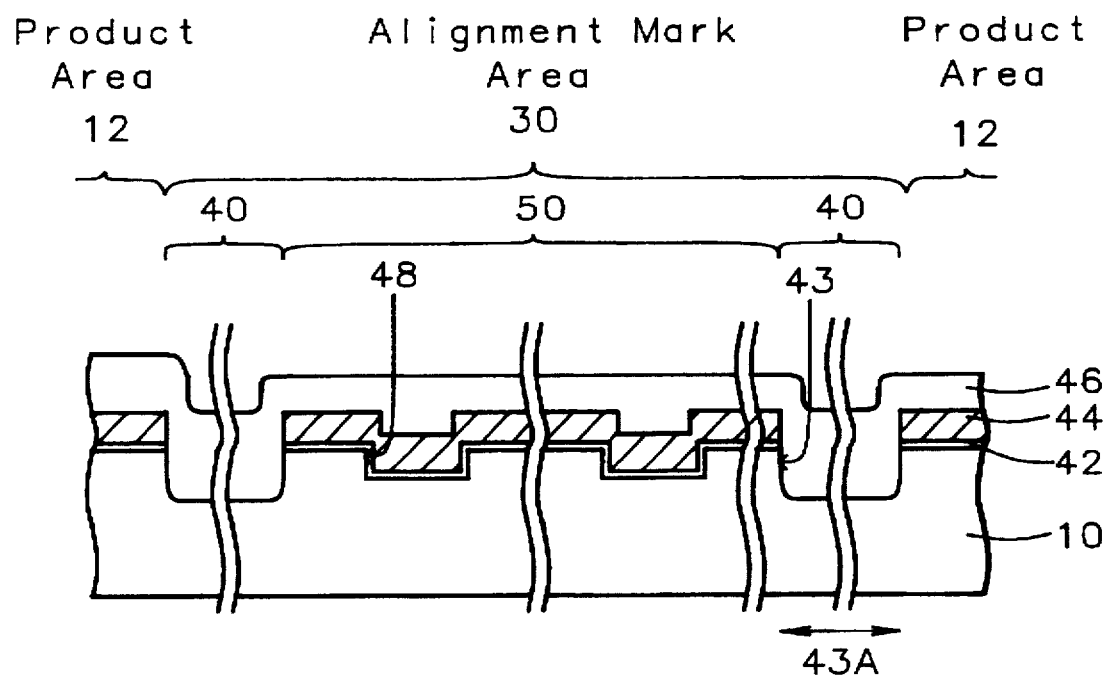
FIG. 2A

METHOD OF FABRICATING A READABLE ALIGNMENT MARK STRUCTURE USING ENHANCED CHEMICAL MECHANICAL POLISHING

BACKGROUND OF INVENTION

1) Field of the Invention

This invention relates generally to the structure and fabrication of alignment marks on semiconductor chips and more particularly to the fabrication of alignment marks for a process using trench isolation and chemical mechanical polishing.

2) Description of the Prior Art

The fabrication of microcircuit devices on a semiconductor wafer involves a number of steps where patterns are transferred from photolithographic masks on the wafer. The masking step includes an etching step and defines selected areas to be exposed on the wafer for subsequent processes such as oxidation, metal deposition and impurity introduction.

In the production of integrate circuit structures, it has become increasingly important to provide structures having a plurality of metallization layers due the ever increasing density of the circuit elements in the structure. Further, as the device and feature sizes becoming smaller, it is important that the photolithographic mask be aligned precisely with the wafer during the masking step to minimized the misalignment between the layers. Most alignment schemes require the use of alignment targets that were defined on the wafers in the previous layer. One such scheme involves the use of two alignment targets that were defined on the wafer subsequent layers being aligned with respect to these two alignment targets. Typically, each alignment target comprises topographical marks which can be formed by etching into the wafer a plurality of steps with a height of, for example 1200 Å and a width and spacing between each step of for example 10 µm. The alignment targets are used to diffract a laser alignment beam generated by a photolithography machine, commonly known as a wafer stepper, during the masking process. The diffraction pattern is received by the wafer stepper and the relative position of the wafer and the photolithographic mask is adjusted accordingly so that the pattern for the photolithographic mask are transferred to the wafer in the precise location as desired.

During the fabrication of the integrated circuit structures, a number of metallization layers are formed. Each of the metallization layer is typically separated from another metallization by an insulating layer. To provide an overlying metallization layer without discontinuities or other flaws, it is desirous to provide an underlying surface for the metallization layer that is as flat or planar as possible. It has therefore, become the practice to smooth the surface of a layer in preparation for a subsequently applied metallization layer by a process of planarization.

Conventional planarization techniques, such as plasma etching or reactive ion etch (RIE) of oxide with a resist planarizing medium, are used to provide a smooth surface and a local planarization with a range of typically less then 1 µm. Smoothing is achieved over a greater range, but the step topography of the alignment targets is preserved since its step spacing is much greater than the planarization range.

However, to meet the demand for more metal and insulating layers in devices and the stringent depth of focus requirement for submicron lithography, a new planarization technique, commonly known as chemical-mechanical polishing (CMP) is used. U.S. Pat. No. 4,944,836, entitled "Chem-Mech Polishing Method of for Producing Coplanar Metal/Insulator film on a Substrate" issued Jul. 31, 1990 to Beyer et al. discloses one such CMP technique. Typically, CMP planarization of the wafer involves holding the wafer against a rotating polishing pad wet with a silica-based alkaline slurry and at the same time applying pressure. Unlike the conventional planarization techniques, the CMP planarization technique provides a global planarization, that is, one that provide a large planarization range the generally covers the whole wafer surface. Since the planarization range is large, the steps of the alignment targets on a new overlying layer on the wafer will be flattened after it is planarized by a the CMP technique. The steps of the alignment targets on the previous layer are not replicated to the overlying layer. The overlying layer will cause alignment target reading problems by interfering with the diffraction pattern, especially where the overlying layer is a thick oxide or a nitride layer. The problem is even worse with when the newly formed overlying layer is highly reflective or opaque.

New isolation processes, such as shallow trench isolation (STI) create a thick oxide layer over the alignment marks and create the readability problems described above. In the STI process, a silicon nitride layer is formed on a wafer and patterned to have openings where trenches will be formed. Trenches are etched in the substrate. A thick oxide layer is deposited in the trenches and over wafer surface. Next, the thick oxide layer is polished (CWP) to create a planar surface. The CMP process leaves a thick oxide layer over the alignment marks that interferes with the alignment mark reader. FIG. 1A shows a conventional alignment mark trench 24 in an alignment mark area 30 (or alignment mark) having the thick insulating layer 22 over the nitride layer 20 and pad oxide layer 11. As can be seen, after the CMP, the insulating layer covers the alignment marks and does not replicate the alignment mark topography. In the unattractive conventional methods, the oxide layer can be removed by the a photo etch process called a window mask (described below). Another non-optimum alternative is to over polish the wafer, thus removing most of the thick oxide over the alignment marks, but at the same time the over polishing removes oxide from the trenches, thus creating isolation and yield problems.

To overcome the problem of non-readable alignment marks where an oxide or other layer covers the alignment marks, the alignment marks can be uncovered by using a process commonly known as a "window mask" process. Performed after CMP planarization and before contact masking, in the window mask process the alignment marks are exposed and the rest of the wafer is covered by a photoresist layer. The layers over the alignment marks are etched away using the window mask as an etch barrier. This way the alignment marks are not covered and clear. Also, metal layer or other opaque layers can be formed over the alignment marks where the metal layers replicate the alignment mark topography. Accordingly, the wafer stepper can now perform alignment between a photolithographic mask and the wafer in the new photolithographic process. However, the additional window mask and etch steps plus the attendant cleaning and inspections, undesirably increase cycle time and process complexity and also introduce particles and defects, resulting in an increase in cost and yield loss. Hence there is a need to provide a method of removing layers from over alignment marks after a CMP planarization process while at the same time eliminating the window mask and etch steps. The present invention addresses such a need.

Other practitioners have proposed solutions to the non-readable alignment mark problem. U.S. 5,456,756

(Ramaswami) preserves alignment marks using a holding apparatus and method where a clamp covers an alignment mark and prevents material from being deposited over the alignment marks. U.S. 5,275,965 (Manning) shows a method of forming trench isolation using gates sidewalls. However, these methods can be further improved.

SUMMARY OF THE INVENTION

It is an object of the present invention to provide a structure and method for providing a readable alignment mark during processing.

It is an object of the present invention to provide a method for removing layers over an alignment mark area using a chemical-mechanical polish (CMP) process.

It is an object of the present invention to provide a method for forming shallow trench isolation on a wafer while removing the insulating layer over alignment mark area without using a photo-etch process.

It is an object of the present invention to provide a method for removing layers over an alignment mark area using a chemical-mechanical polish (CMP) process involving a locally enhanced polishing of the alignment mark area.

To accomplish the above objectives, the present invention provides a method of manufacturing a readable alignment mark in an alignment mark area on a semiconductor substrate. A semiconductor substrate 10 comprising a product area 12 and an alignment mark area 30 is provided. The alignment mark area 30 has an outer area 40 and an inner area 50. The outer area 40 surrounds the inner area 50. A plurality of alignment mark trenches 48 is formed in the substrate 10 within the inner area 50. A pad oxide layer 42 and a silicon nitride layer 44 are formed sequentially at least in the alignment mark area 30. A portion the SiN layer 44 is removed from the outer area 40 of the alignment mark area 30 using a photolithographic process. A trench 43 is formed in the substrate 10 in at least the outer area 40 using the SiN layer 44 as a mask. An insulating layer 46 composed of oxide is formed at least over the alignment mark area 30. The insulating layer 46 is chemical-mechanical polished thereby removing a first thickness of the insulating layer from the inner alignment mark area 50. Next, a wet dip etch removes the remaining insulating layer from over the inner alignment mark area 50. This wet dip etch will not damage the polished trenches 44. A nitride etch is used to remove the silicon nitride layer 44 in the inner alignment mark area 50. Lastly, the pad oxide layer 42 is removed in the inner alignment mark area 50 thus making the alignment marks (trenches 43) readable.

The isolation trench 43 in the outer area 40 of the alignment marks of the invention causes the CMP to remove most or all of the insulating layer 46 from over the inner area 50 in the alignment mark trenches. The lack of a silicon nitride layer (54) and the insulating layer 46 in the isolation trench 43 adjacent to the inner alignment mark area 50 causes a locally enhanced polish rate which removes more of the insulating layer 46 over the inner area 50 than over the adjacent product area 12. The removal of the layer 46 44 42 over the alignment mark trenches 48 in the inner area 50 makes the alignment mark trenches 48 more readable and distinct.

BRIEF DESCRIPTION OF THE DRAWINGS

The features and advantages of an alignment mark according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A is a cross sectional view of an alignment mark of the prior art.

FIG. 2A is a cross sectional view of the alignment mark area of the present invention.

DETAILED DESCRIPTION OF THE PREFERRED EMBODIMENTS

Figure 2B:
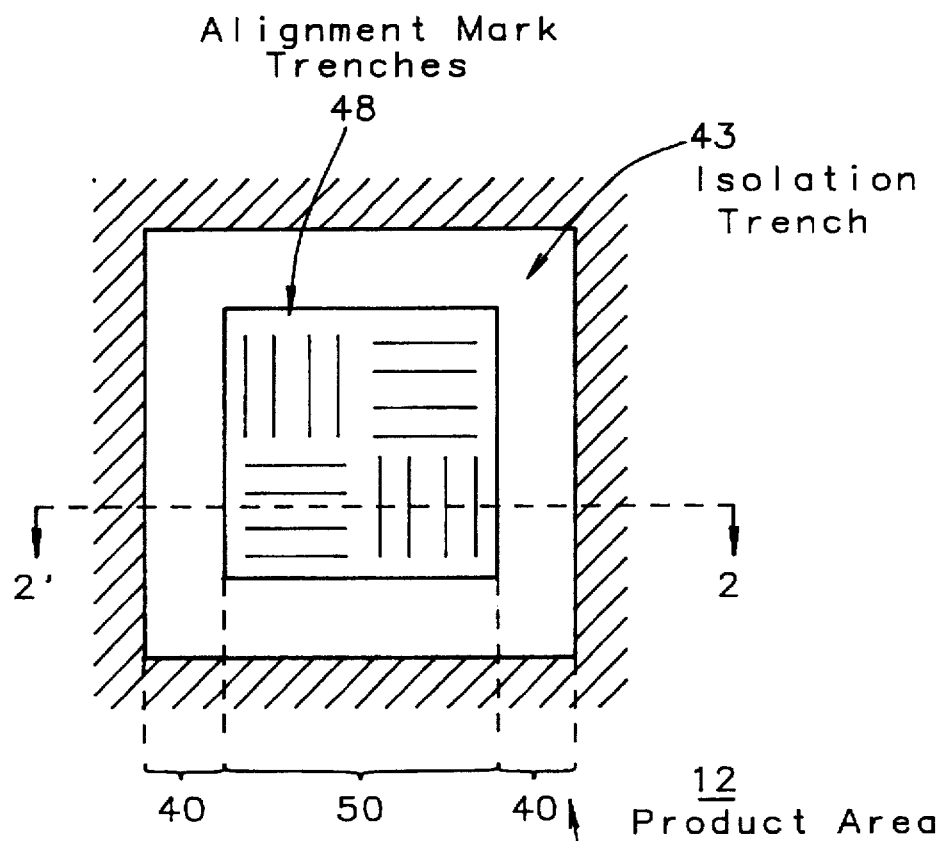
FIG. 2B is a top down view of the alignment mark area of the present invention.

The present invention will be described in detail with reference to the accompanying drawings. The present invention provides a structure and a method of forming a alignment mark area on a semiconductor structure that is more readable than conventional alignment marks. The process of forming the alignment mark is described herein but the simultaneously processes used to form product semiconductor devices are not described. It should be well understood by one skilled in the art that by including additional process steps not described in this embodiment, other types of devices can also be included on the wafer. For example, P wells in the P substrate and CMOS circuit can be formed therefrom. It should also be understood that the figures depict only one alignment mark area out of a several of alignment mark areas that can be fabricated simultaneously on the substrate.

As shown in FIG. 2A, a semiconductor structure 10 comprising a semiconductor substrate 10 is provided. Semiconductor structure is understood to possibly include a semiconductor wafer, active and passive devices formed within the wafer and insulating and conductive layers formed over the wafer surface. The semiconductor structure is a product of processes performed on a semiconductor substrate.

As shown in FIGS. 2A, 2B, 3A, 3B, 4 and 5 the semiconductor structure 10 comprises a product area 12 and an alignment mark area 30. The product area is the area where semiconductor devices are formed, such as MOS transistors. The alignment mark area 30 is where alignment marks 48 (e.g., alignment mark trenches, alignment mark steps) are formed. The alignment mark area 30 have any shape and is preferably a square shape with length/width 54 in a range of between about 3.0 and 4.0 mm and more preferably about 3.5 mm.

As shown in FIGS. 2A, 2B, 2C, 3A, 3B, 4 and 5 the alignment mark area 30 has an outer area 40 and an inner area 50. The outer area surrounds 40 the inner area 50. The alignment mark area 30 is preferably square shaped having a length/width 34 in a range of between about 3.0 and 4.0 mm and more preferably about 3.5 mm. The inner area 40 is preferably square shaped having a length/width 54 in a range of between about 1.4 and 1.8 mm and more preferably about 1.6 mm. The outer area 40 occupies the alignment mark area 30 that the inner area 40 does not occupy. FIG. 2B is a top plan view of the alignment mark area 30 and product area. FIGS. 2A, 3A, 3B, 4 and 5 are cross sectional views along axis 2/2' in FIG. 2B.

A plurality of alignment mark trenches 48 (i.e., alignment marks) is formed in the semiconductor structure 10 within the inner area 50. The alignment mark trenches 48 are the alignment marks that are read by an alignment mark reading machine, such as built in to some photolithography equipment or read by operators. These alignment mark trenches 48 should have clear distinct sharp edges to reflect light and are preferably not covered with layers that block out light. The alignment mark trenches 48 preferably have a depth (into the semiconductor structure) in a range of between about 1000 and 1400 Å and more preferably about 1200 Å, and a width in a range of between about 8 and 10 µm.

Next, a pad oxide layer 20 and a silicon nitride layer 44 are formed sequentially over at least the alignment mark area 12. The pad oxide layer is preferably formed by a conventional thermal oxidation. The pad oxide layer 42 preferably has a thickness in a range of between about 100 and 150 Å.

The silicon nitride layer 44 is preferably formed using a conventional LPCVD process. The silicon nitride layer 44 preferably has a thickness in a range of between about 1500 and 2000 Å.

As shown in FIG. 2A, a portion the SiN layer 20 is removed from the outer area 40 of the alignment mark area 30. The silicon nitride layer 20 can be removed from the outer area 40 using conventional photolithography techniques.

Still referring to FIG. 2A, in an important step, an isolation trench 43 (CMP isolation trench 43) is formed in the semiconductor structure (e.g., substrate) 10 in at least the outer area 40. The isolation trench 43 causes the enhance chemical-mechanical polishing (CMP) of the alignment mark area 30 as is explained below. The isolation trench 43 can be formed by the conventional photo processes of masking and etching. The silicon nitride layer 44 is patterned forming an opening over portions of the outer area 40 surrounding the inner area 50. The isolation trench can be formed by using the SiN layer 44 as a mask. The trench 43 has width 43A in a range of between about 0.85 and 1.05 mm and depth in a range of between about 5000 and 7000 Å (the depth measurement includes the silicon trench, pad ox and silicon nitride layer thicknesses). Also, the depth of the isolation trench 40 43 is preferably larger than the thickness of the overlying insulating layer 46.

When the invention is implemented on product that uses a shallow trench isolation (STI) process, the isolation trench 43 is formed preferably at the same time the STI is formed on the product devices. (i.e., formed by the same photo process steps as used to form shallow trench isolation (STI) on devices in the product area). When the invention is implemented on non-shallow trench isolation product or implemented at another process step other than a STI trench etch step, a photo step will be performed to form the CMP isolation trench 43 in the outer alignment mark area 40.

Figure 2C:
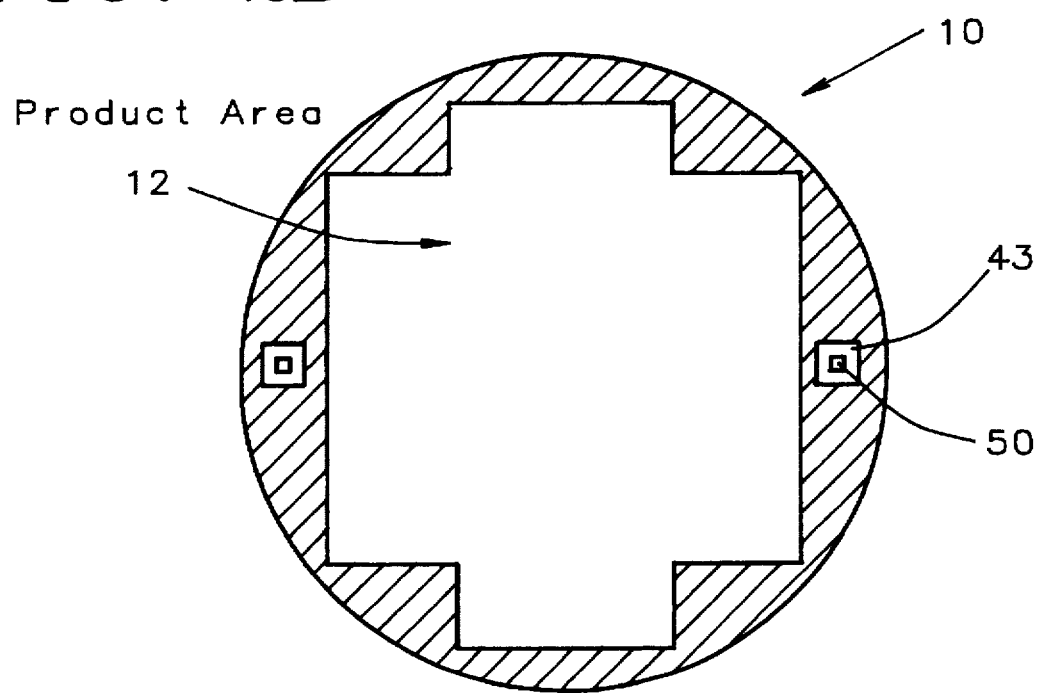
FIG. 2C is a top down view of a semiconductor substrate having one embodiment of the alignment mark area of the present invention.
Figure 3A:
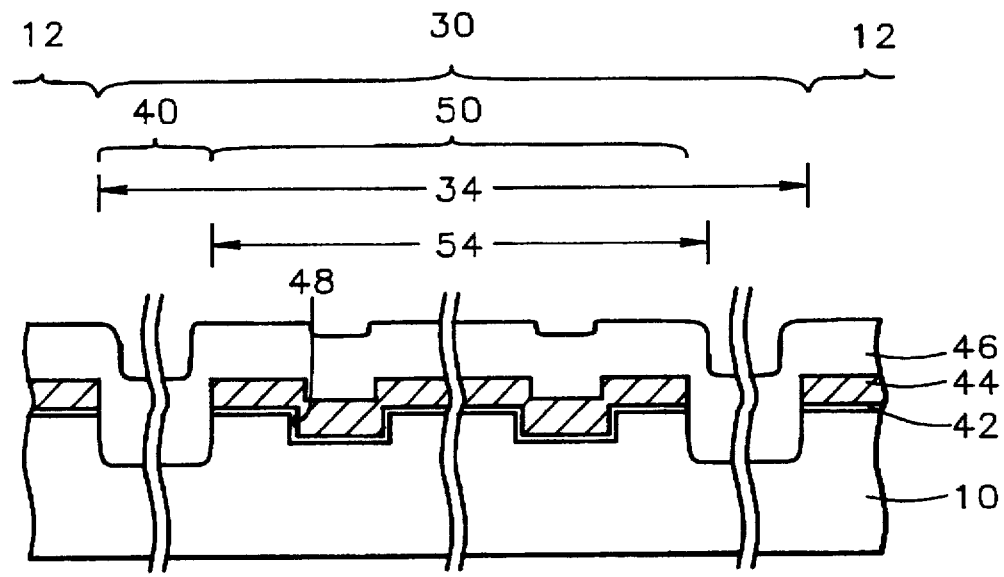
FIG. 3A is a cross sectional view of the alignment mark of the present invention before the CMP process.
Figure 3B:
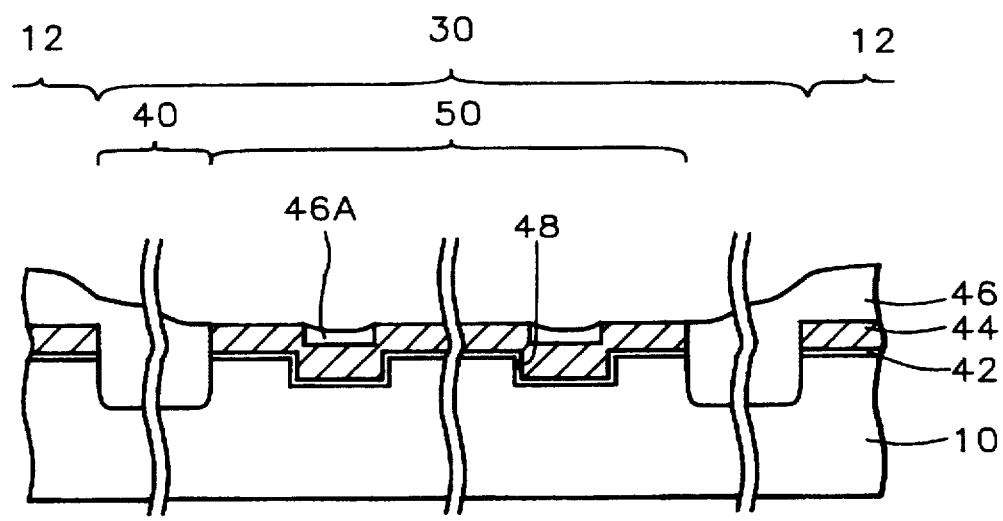
FIG. 3B is a cross sectional view of the alignment mark of the present invention after the chemical-mechanical polish (CMP) process with locally enhanced polishing over the inner area of the alignment mark area.

FIG. 2B shows a top down view of the alignment mark area of the present invention. The outer region 40 surrounds the inner region. The cross sectional views in FIGS. 2A, 3A and 3B are take along the line 2 in FIG. 2B. FIG. 2C shows a top down view of a semiconductor structure having the alignment mark of the present invention. The product area 12 can have product devices and includes patterns of STI (trench isolation) and areas covered with active area and other insulating and conductive layers. The non-product area are shown covered with the silicon nitride and insulating layer.

An insulating layer 46 is formed at least over the alignment mark area 30. The insulating layer is preferably composed of silicon oxide. The insulating layer composed of silicon oxide is preferably formed using TEOS CVD assisted by $O_3$ addition. The first insulating layer 46 preferably has thickness in a range of between about 5000 and 7000 Å and more preferably about 6000 Å.

As shown in FIGS. 3A and 3B, the insulating layer 46 is chemical-mechanical polished thereby removing a first thickness of the insulating layer 46 from the inner alignment mark area 50. FIG. 3A shows the insulating layer 46 over the alignment mark area 30 before the CMP process. FIG. 3B shows the insulating layer 46 removed from over the alignment mark area 30 by the locally enhanced CMP process in the inner area. The first thickness of insulating layer 46 removed by the chemical-mechanical polishing in the inner area 50 is preferably in a range of between about 6000 and 8000 Å and more preferably about 7000 Å (or so all the insulating layer 46 is removed over the silicon nitride layer 44 in the inner area 50. The CMP process preferably "over" polishes the silicon nitride layer 44 in the inner area as shown in FIG. 3B. FIG. 3B shows a residual insulating layer 46A left in the alignment mark trenches 48 after the CMP overpolish. The residual insulating layer 46A often has a thickness in a range of between about 1000 and 1200 Å. The objective is to minimize the thickness of this residual insulating layer without removing too much oxide from the product areas, in particular from the shallow trench isolation regions in the product areas (if formed). The thinner the residual insulating layer 46A, the shorter a subsequent oxide dip etch can be, thus minimizing oxide loss from the product areas. The thickness of insulating layer 46 removed by the chemical-mechanical polishing in the product area 12 is preferably in a range of between about 5000 and 7000 Å and more preferably about 6000 Å.

The CMP rate is higher in the inner area 50 over the alignment marks 48 and therefore more or most of the insulating layer 46 is removed over the alignment marks. The alignment structure of the present invention realizes CMP rates is advantageously between about 1.1 and 1.5 times faster that the CMP rate in the product areas. The CMP rate is locally enhanced over the inner area because in the surrounding outer area 40 the nitride layer is missing and the insulating layer is lower (in the isolation trench 43).

Figure 4:
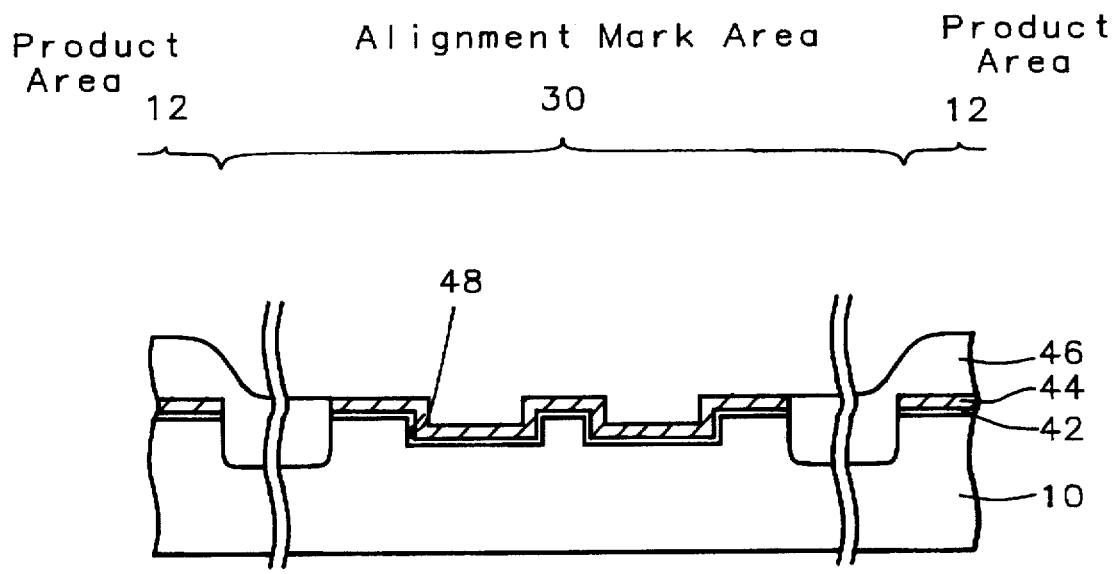
FIG. 4 is a cross sectional view of the alignment mark structure of the present invention after a dip etch removes the residual insulating layer 46 from the alignment mark trenches 48.
Figure 5:
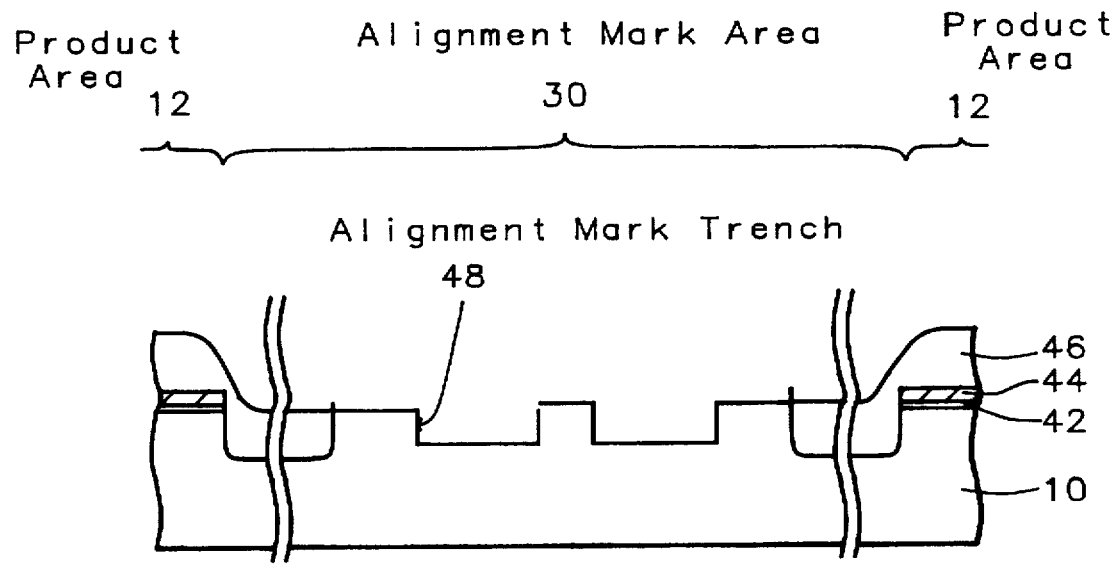
FIG. 5 is a cross sectional view of the alignment mark structure of the present invention after a series of etches removes the silicon nitride layer 44 and the pad oxide layer 42 over the alignment mark area 30 making the alignment mark trenches 48 readable.

Next, an optional oxide etch is used to remove the residual insulating layer 46A from the alignment mark trenches 48 as shown in FIG. 4. The oxide etch can be a wet etch, such as a HF or a buffered oxide etch (BOE) etch. It is important to remove the residual oxide 46A in the alignment mark trenches so that a subsequent nitride etch can remove the silicon nitride layer 44 in the inner alignment mark area 50. The residual oxide 46A should be removed so that a good readable alignment mark profile is transferred to subsequently deposited layers.

Next, optionally, the exposed SiN layer 46 in the inner area 50 is removed. The exposed SiN layer 46 is preferably removed using a wet etch such as a 85% phosphoric acid etch boiling at 180° C. It is important that the residual oxide 46A is removed from the trenches because the phosphoric etch will not remove oxide. The alignment mark structure (e.g., trench 43) which creates the enhanced chemical-mechanical polishing (CMPing) over the alignment mark is important so that all the insulating layer 46, silicon nitride layer 44 and pad oxide layer 42 are removed over the alignment marks 43 while leaving these layer on the appropriate product areas.

The pad oxide layer 42 in the alignment mark area is then optionally removed using an oxide etch. After the SiN layer 44 and pad oxide layer 42 are removed, the alignment marks 43 can be used by alignment tools for further processing. Such alignment tools include ASML steppers, by ASML, Netherlands. Often the photo tool's mask/wafer alignment in all photo steps relies upon the alignment marks created initially (zero layer) on the substrate.

The alignment mark structure of the present invention and the enhanced polishing method be applied to all CMP processes steps, such as after the first metal layer, (non-STI processes) etc. In addition, the invention can be applied to product using a shallow trench isolation (STI) regions where the opening in the silicon nitride layer 44 used to form the trench 43 can be performed during the photo/etch processes used to form the shallow trench isolation (STI) on product areas. For better geographical isolation, the depth of the isolation trench 40 43 is preferably larger than the depth of the shallow isolation trenches (not shown) in the product areas 12. Also, the depth of the isolation trench 40 43 is preferably larger than the insulating layer 46.

The CMP Preston Equation can be used to predict the chemical-mechanical polish rate as a function polishing conditions and the alignment mark structure.

CMP Preston equation:

$$\frac{dH}{dt} = (K_p)\frac{L}{A}(S)$$

Where:

H is the oxide thickness (being removed)

$K_p$ is Preston coefficient

L is the down ward force

A is the polish area

S is relative speed between the platen (polish pad) and the wafer.

The Preston equation can be used to calculate the invention's locally enhanced CMP rate in the inner area 50 because under a given down force and S, the polish rate increase as the polish area decreases. Here, the invention's trench 43 reduces the polish area and thus increases the local polish rate in the alignment mark area.

The isolation trench in the outer area 40 of the alignment mark of the invention causes the CMP to remove most or all of the insulating layer 46 from over the alignment mark trenches 48. The lack of a silicon nitride layer 44 and the insulating layer 46 in the isolation trench 43 causes a locally enhanced polish rate which removes more of the insulating layer 46 over the inner area 50 than over the product area 12. See FIGS. 3A and 3B. The locally enhanced CMP rate in the inner area 50 is about 1.3 times as fast as the CMP rate in the product areas. The thinner insulating layers over the alignment mark trenches in the inner area make the alignment mark trenches more readable and distinct.

The invention provides a semiconductor structure having a readable alignment mark comprising; a semiconductor structure comprising a product area and an alignment mark area, the alignment mark area having an outer area and an inner area, the outer area surrounding the inner area; a plurality of alignment mark trenches in the substrate within the inner area; a pad oxide layer and a silicon nitride layer over at least the alignment mark area; an isolation trench through the silicon nitride layer, the pad oxide layer and the substrate in a the outer area of said alignment mark area.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a readable alignment mark in an alignment mark area on a semiconductor structure, comprising:

a) providing a semiconductor structure comprising a product area and an alignment mark area, said alignment mark area having an outer area and an inner area, said outer area surrounding and immediately adjacent to said inner area;

b) forming a plurality of alignment mark trenches in said structure within said inner area;

c) forming an isolation trench in said semiconductor structure in at least said outer area; said isolation trench surrounding and immediately adjacent to said inner area, d) forming an insulating layer at least over said alignment mark area; and e) chemical-mechanical polishing said insulating layer removing a first thickness of said insulating layer from said inner alignment mark area; said isolation trenches accelerate the rate of the chemical mechanical polishing of said insulating layer over said alignment mark trenches in said inner area.

2. The method of claim 1 wherein said alignment mark trenches have a depth in a range of between about 1000 and 1400 Å and a width in a range of between about 8 and 10 µm.

3. The method of claim 1 wherein said alignment mark area has a width in a range of between about 3.0 and 4.0 mm and length in a range of between about 3.0 and 4.0 mm.

4. The method of claim 1 wherein said inner area has a width in a range of between about 1.4 and 1.8 mm and a length in a range of between about 1.4 and 1.8 mm.

5. The method of claim 1 wherein said isolation trench is formed by forming sequentially a pad oxide layer and a silicon nitride layer over at least said alignment mark area; removing a portion of said silicon nitride layer from said outer area of said alignment mark area using a photolithographic process, and etching said isolation trench in said semiconductor structure in at least said outer area using said silicon nitride layer as a mask.

6. The method of claim 1 wherein said insulating layer is composed of oxide and has thickness in a range of between about 5000 and 7000 Å.

7. The method of claim 1 wherein said first thickness of said insulating layer removed by the chemical-mechanical polishing is in a range of between about 5000 and 7000 Å.

8. The method of claim 1 wherein said isolation trench has width in a range of between about 0.85 and 1.05 mm and depth in a range of between about 5000 and 7000 Å.

9. The method of claim 1 wherein the depth of said isolation trench is larger than the thickness of said insulating layer.

10. The method of claim 1 wherein said isolation trench is formed by a photolithographic mask and etch process and the photolithographic mask and etch process simultaneously forms shallow trench isolation (STI) regions in the product area.

11. A method of fabricating a readable alignment mark in an alignment mark area on a semiconductor substrate, comprising:
   a) providing a semiconductor structure comprising a product area and an alignment mark area, said alignment mark area having an outer area and an inner area, said outer area surrounding and immediately adjacent to said inner area;
   b) forming a plurality of alignment mark trenches in said structure within said inner area;
   c) forming sequentially a pad oxide layer and a silicon nitride layer over at least said alignment mark area;
   d) patterning said silicon nitride layer forming an opening over at least over a portion of said outer area of said alignment mark area
   e) etching said silicon nitride layer and said pad oxide and said substrate, through said opening in said silicon nitride layer as a mask, forming an isolation trench in said semiconductor structure in at least said outer area; said isolation trench surrounding and immediately adjacent to said inner area;
   f) forming an insulating layer of composed of oxide at least over said alignment mark area;
   g) chemical-mechanical polishing said insulating layer removing a first thickness of said insulating layer from said inner alignment mark area and leaving a residual insulating layer in said alignment mark trenches;
   h) removing said residual insulating layer from said alignment mark trenches using a dip etch;
   i) removing said silicon nitride layer and said pad oxide layer from said inner area thereby exposing said alignment mark trenches and making said alignment mark trenches readable.

12. The method of claim 11 wherein said alignment mark trenches have a depth in a range of between about 1000 and 1400 Å and a width in a range of between about 8 and 10 μm.

13. The method of claim 11 wherein said alignment mark area has a width in a range of between about 3.0 and 4.0 mm and length in a range of between about 3.0 and 4.0 mm.

14. The method of claim 11 wherein said inner area has a width in a range of between about 1.4 and 1.8 mm and a length in a range of between about 1.4 and 1.8 mm.

15. The method of claim 11 wherein said isolation trench is formed by removing a portion of said SiN layer from said outer area of said alignment mark area using a photolithographic process and etching said isolation trench in said semiconductor structure in at least said outer area using said SiN layer as a mask.

16. The method of claim 11 wherein said isolation trench is formed by a photolithographic mask and etch process simultaneously with shallow trench isolation (STI) regions formed in said product area.

17. The method of claim 11 wherein said first insulating layer has thickness in a range of between about 5000 and 7000 Å.

18. The method of claim 11 wherein said first thickness of said insulating layer removed by the chemical-mechanical polishing is in a range of between about 5000 and 7000 Å.

19. The method of claim 11 wherein said isolation trench has width in a range of between about 0.85 and 1.05 mm and depth in a range of between about 5000 and 7000 Å.

20. The method of claim 11 wherein the depth of said isolation trench is larger than the thickness of said insulating layer.

21. The method of claim 11 wherein said isolation trench is formed by a photolithographic mask and etch process and the photolithographic mask and etch process simultaneously forms shallow trench isolation (STI) regions in the product area, and wherein the depth of said isolation trench is larger than the depth of said shallow trench isolation regions in said product area.

22. A method of fabricating a readable alignment mark in an alignment mark area on a semiconductor substrate, comprising:
   a) providing a semiconductor structure comprising a product area and an alignment mark area, said alignment mark area having an outer area and an inner area, said outer area surrounding and immediately adjacent to said inner area;
   b) forming a plurality of alignment mark trenches in said structure within said inner area;
   c) forming sequentially a pad oxide layer and a silicon nitride layer over at least said alignment mark area;
   d) patterning said silicon nitride layer forming an opening over at least over a portion of said outer area of said alignment mark area and product isolation openings in said product area;
   e) etching said silicon nitride layer and said pad oxide and said substrate, through said opening in said silicon nitride layer as a mask, forming an isolation trench in said semiconductor structure in at least said outer area; said isolation trench surrounding said inner area and said alignment mark trenches and product isolation trenches in said product area; said isolation trench has width in a range of between about 0.85 and 1.05 mm and depth in a range of between about 5000 and 7000 Å;
   f) forming an insulating layer of composed of oxide at least over said alignment mark area and in said product isolation trench;
   g) chemical-mechanical polishing said insulating layer removing a first thickness of said insulating layer from said inner alignment mark area and leaving a residual insulating layer in said alignment mark trenches and in said product isolation trenches;
   h) removing said residual insulating layer from said alignment mark trenches using a dip etch;
   i) removing said silicon nitride layer and said pad oxide layer from said inner area thereby exposing said alignment mark trenches and making said alignment mark trenches readable;
   j) whereby said isolation trenches accelerate the rate of the chemical mechanical polishing of said insulating layer over said alignment mark trenches in said inner area.

* * * * *